US010551753B2

(12) United States Patent
Hosaka

(10) Patent No.: US 10,551,753 B2
(45) Date of Patent: Feb. 4, 2020

(54) IMPRINT DEVICE, SUBSTRATE CONVEYING DEVICE, IMPRINTING METHOD, AND METHOD FOR MANUFACTURING ARTICLE

(71) Applicant: CANON KABUSHIKI KAISHA, Tokyo (JP)

(72) Inventor: Takashi Hosaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 319 days.

(21) Appl. No.: 15/137,485

(22) Filed: Apr. 25, 2016

(65) Prior Publication Data

US 2016/0320716 A1 Nov. 3, 2016

(30) Foreign Application Priority Data

Apr. 30, 2015 (JP) .................................. 2015-093570

(51) Int. Cl.
*G03F 9/00* (2006.01)
*G03F 7/00* (2006.01)

(52) U.S. Cl.
CPC .......... *G03F 9/7042* (2013.01); *G03F 7/0002* (2013.01)

(58) Field of Classification Search
CPC ...... G03F 9/7042; G03F 7/0002; G03F 7/707; G03F 7/70708; G03F 7/70716; G03F 7/70725

See application file for complete search history.

(56) References Cited

U.S. PATENT DOCUMENTS

| 2008/0192226 | A1* | 8/2008 | Shibazaki | ........... G03F 7/70716 355/72 |
| 2009/0026657 | A1 | 1/2009 | Nimmakayala et al. | |
| 2010/0134779 | A1 | 6/2010 | Yasuda et al. | |
| 2012/0050740 | A1 | 3/2012 | Hoogendam et al. | |
| 2012/0274006 | A1* | 11/2012 | Matsumoto | ........... B29C 43/021 264/571 |
| 2013/0329208 | A1* | 12/2013 | Yasuda | ............... G03F 7/70341 355/72 |

(Continued)

FOREIGN PATENT DOCUMENTS

CN 101351878 A 1/2009
JP H10-275850 A 10/1998
(Continued)

*Primary Examiner* — Leith S Shafi
(74) *Attorney, Agent, or Firm* — Canon U.S.A., Inc. IP Division

(57) ABSTRACT

An imprint device that forms a pattern by having the imprint material on a substrate and a mold come in contact with each other, the imprint device including a substrate holding unit that holds the substrate with a suction unit including partial areas, a moving unit including the substrate holding unit, a mold release being performed while a suction force of a partial area corresponding to an area in which the pattern is formed is set weaker than a suction force of other partial areas, an acquisition unit acquiring measurement data indicating a positional relationship between the substrate and the substrate holding unit, a target of the measurement data including an end portion of the substrate and the substrate holding unit, and a processor unit obtaining a correction amount to correct a positional deviation of the substrate with respect to the substrate holding unit using the acquired measurement data.

10 Claims, 13 Drawing Sheets

(56) References Cited

U.S. PATENT DOCUMENTS

2014/0253899 A1 9/2014 Hirano
2014/0273523 A1* 9/2014 Rathsack .......... H01L 21/02269
   438/781
2015/0109600 A1 4/2015 Mizumoto

FOREIGN PATENT DOCUMENTS

| | | |
|---|---|---|
| JP | 2010-098310 A | 4/2010 |
| JP | 2010118684 A | 5/2010 |
| JP | 2012-234913 A | 11/2012 |
| TW | 200633009 A | 9/2006 |
| TW | 201250779 A | 12/2012 |
| TW | 201502698 A | 1/2015 |
| TW | 201506998 A | 2/2015 |
| WO | WO-2013136733 A1 * | 9/2013 .......... G03F 7/0002 |

* cited by examiner 34-a 34-d 34-b 34-c

IMPRINT DEVICE, SUBSTRATE CONVEYING DEVICE, IMPRINTING METHOD, AND METHOD FOR MANUFACTURING ARTICLE

BACKGROUND OF THE INVENTION

Field of the Invention

The present disclosure relates to an imprint device, a substrate conveying device, an imprinting method, and a method for manufacturing an article.

Description of the Related Art

An imprint technology is known as a technology for fabricating a semiconductor device and the like. The imprint technology is a technology of forming a pattern on an imprint material (resin) supplied on a substrate by using a mold formed thereon with a pattern. In the imprint technology, a mold (a mask) on which a pattern is formed using an electron beam drawing device or the like is made to come in contact with an imprint material supplied on a substrate (imprinting). Subsequently, while the mold and the imprint material are in contact with each other, the imprint material is cured. Then, the gap between the cured imprint material and the mold is widened (mold release) such that a pattern is formed on the imprint material.

There are cases in which a plurality of shot areas are formed on the substrate that has been conveyed into the imprint device. After the pattern is formed in each of the shot areas in the above manner and after formation of the pattern has been completed in all of the shot areas on the substrate, the substrate is conveyed out of the imprint device.

The substrate that has been conveyed into the imprint device is held by a substrate chuck (a substrate holding unit). Typically, a substrate chuck holds a substrate by suctioning the entire surface (the whole area) of the backside of the substrate at once. On the other hand, a substrate chuck that is configured such that the suction area of the substrate chuck is divided into a plurality of partial areas is known in Japanese Patent Laid-Open No. 2010-098310. Furthermore, a technology of reducing the tilting phenomenon of the resin pattern when the mold is released by weakening the suction force on the suction area that suctions the substrate backside corresponding to the shot area and the like where the pattern is formed so that the substrate is released while being deformed in an upwardly convex manner, is known in Japanese Patent Laid-Open No. 2012-234913.

Note that the positional relationship between a conveyance arm that conveys the substrate and the substrate chuck that holds the substrate may change due to change with time in the platen and the like to which each unit of the imprint device is fixed, vibration caused by driving of the actuator and the like, or attachment and detachment of the substrate and the like. In such a case, the conveyed substrate and the substrate chuck holding the substrate may be positionally deviated from each other. In Japanese Patent Laid-Open No. 10-275850, in order to detect the amount of positional deviation of the substrate with respect to the substrate chuck, a microscope that measures (observes) the edge of the substrate is provided. An exposure apparatus is proposed in which, the amount of positional deviation of the substrate with respect to the substrate chuck is detected with the microscope, and on the basis of the amount of positional deviation, the driving amount of the substrate stage is corrected to align the substrate.

In Japanese Patent Laid-Open No. 2012-234913, in a case in which the substrate and the substrate chuck are positionally deviated from each other, when the release of the mold is performed while the suction force of the suction area corresponding to the shot area and the like in which the pattern is formed is weakened, the inclination of the pattern may increase due to occurrence of positional deviation between the shot area and the like and the suction area.

Furthermore, the method described in Japanese Patent Laid-Open No. 10-275850 only corrects the driving amount of the substrate state on the basis of the measurement value of the deviation of the conveyance position of the substrate with respect to the substrate chuck, and does not reduce the amount of positional deviation between the substrate and the substrate chuck. Accordingly, the substrate and the substrate chuck are still in a positionally deviated state with respect to each other. Accordingly, the increase in tilting of the pattern during the release described above in the imprint device that performs releasing while the suction force of the suction area corresponding to the shot area in which the pattern is formed is weakened is not resolved.

SUMMARY OF THE INVENTION

The present disclosure provides an imprint device, a substrate conveying device, an imprinting method, and a method for manufacturing an article, which is capable of reducing positional deviation between a substrate and a substrate holding unit.

An imprint device that is one of the aspects of the present disclosure forms a pattern on an imprint material by having the imprint material on a substrate and a mold come in contact with each other. The imprint device includes a substrate holding unit that holds the substrate with a suction unit that includes a plurality of partial areas, a moving unit that includes the substrate holding unit and that moves, a mold release being performed while in a state in which a suction force of a partial area, among the plurality of partial areas, corresponding to an area of the substrate in which the pattern is formed is set weaker than a suction force of other partial areas, an acquisition unit that acquires measurement data indicating a positional relationship between the substrate and the substrate holding unit, a target of the measurement data including an end portion of the substrate held by the substrate holding unit and the substrate holding unit, and a processor unit that obtains a correction amount used to correct a positional deviation of the substrate, on which the pattern is formed, with respect to the substrate holding unit by using the measurement data that has been acquired.

Further features of the present invention will become apparent from the following description of exemplary embodiments with reference to the attached drawings.

DESCRIPTION OF THE EMBODIMENTS

Figure 1:
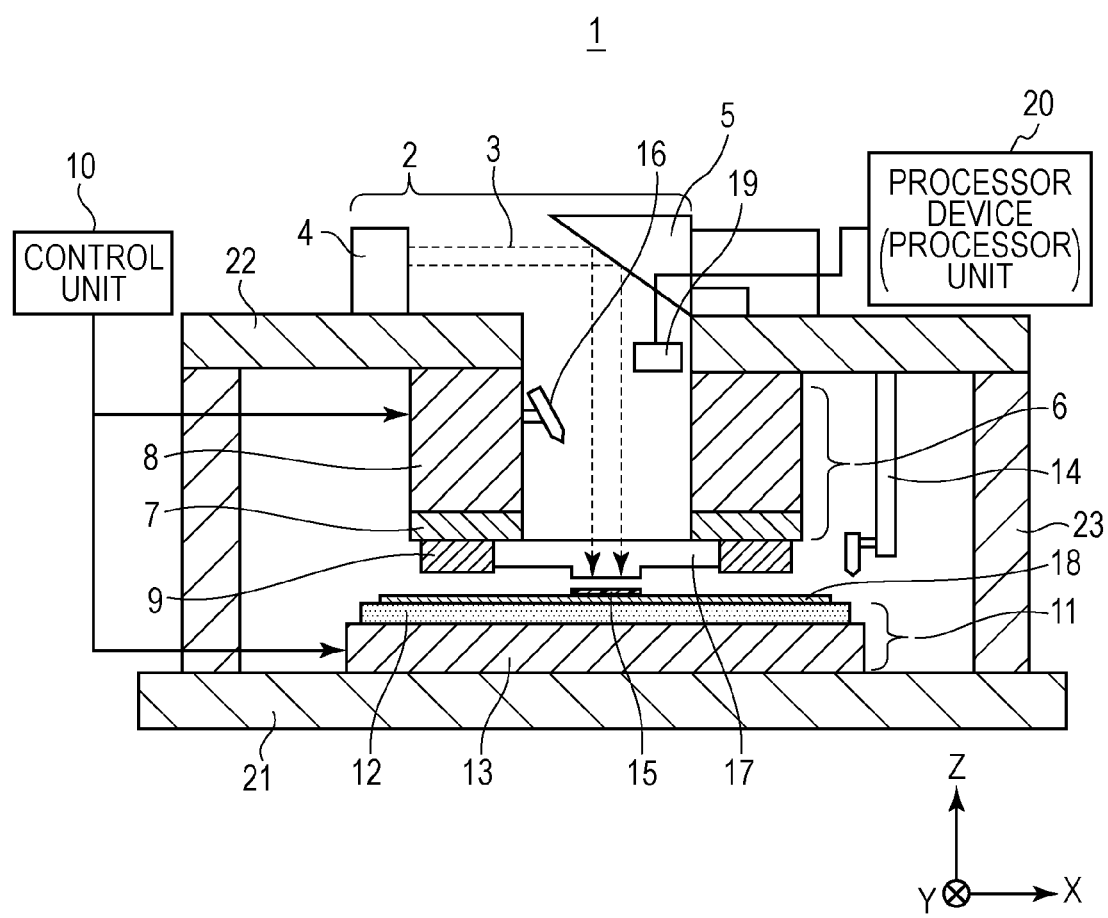
FIG. 1 is a diagram illustrating a representative example of a device configuration of an imprint device according to a first exemplary embodiment.

Hereinafter, preferred exemplary embodiments of the present disclosure will be described in detail with reference to the drawings. In each drawing, the same members will be attached with the same reference numerals and redundant description thereof will be omitted.

First Exemplary Embodiment

Referring to FIGS. 1 to 13, an imprint device according to a first exemplary embodiment will be described.

FIG. 1 is a diagram illustrating a representative example of a device configuration of the imprint device according to the first exemplary embodiment. An imprint device 1 is an imprint device that forms a concave-convex pattern of a mold on a substrate to be processed. Furthermore, the imprint device 1 is a device that employs, among imprint technologies, a method in which a resin (an imprint material) is cured with light, such as ultraviolet rays, when forming the concave-convex pattern of the mold. As illustrated in FIG. 1, an axis that is parallel to the direction in which a mold 17 is irradiated with an ultraviolet ray is a Z-axis, and an X-axis and a Y-axis are defined by a direction orthogonal to the Z-axis. Note that the imprint device 1 may be an imprint device that cures resin by irradiation of light having a wavelength range other than that of an ultraviolet ray or may be an imprint device that cures resin through another energy, such as thermal energy.

The imprint device 1 includes the mold 17, an illumination unit 2, a mold holding unit 6, a substrate holding unit 11, a resin coating unit 14, an alignment measuring unit 16, and a control unit 10. A substrate 18 may be a substrate to be processed (a semiconductor wafer, for example) for performing a pattern, or may be a tool substrate for performing positioning of the substrate and a substrate chuck.

The mold 17 is a mold having a rectangular outer peripheral portion, and a convex-concave pattern that has a three-dimensional shape that is to be formed on the resin coated on the substrate 18 is formed on a surface of the mold 17 facing the substrate 18. Note that a material that transmits ultraviolet rays, such as quartz, is used as the material of the mold 17.

The illumination unit 2 is a unit that projects an ultraviolet ray on the mold 17 when imprinting is performed. The illumination unit 2 includes a light source 4, a plurality of optical systems for adjusting an ultraviolet ray 3 projected from the light source into a light that is appropriate for imprinting, and a scanning mechanism 5 for scanning the substrate surface with the ultraviolet ray.

The mold holding unit 6 is a unit for holding and fixing the mold 17 and for forming a concave-convex pattern of the mold 17 on the substrate 18. The mold holding unit 6 includes a mold chuck 7, a mold stage 8, and a mold-shape correction mechanisms 9. The mold chuck 7 holds the mold 17 with a mechanical holding member (not shown). Furthermore, the mold chuck 7 is held by the mold stage 8 with a mechanical holding member (not shown). When the concave-convex pattern of the mold 17 is formed on the substrate 18, the mold stage 8 serves as a driving system for setting the position between the substrate and the mold and moves the mold 17 up and down in the Z-axis direction. Furthermore, since positioning with high accuracy is required when forming the concave-convex pattern, the mold stage 8 may include a plurality of driving systems, such as a coarse motion driving system and a fine motion driving system. Furthermore, the mold stage 8 may have a function of adjusting the position in the X-axis direction, the Y-axis direction, and in the direction θ (rotating about the Z-axis) other than in the Z-axis and may have a tilt function for correcting the inclination of the mold. The mold-shape correction mechanisms 9 are mechanisms to correct the shape of the mold 17 and are disposed at plural locations so as to surround the outer peripheral portion of the mold. The mold-shape correction mechanisms 9 are capable of correcting the shape of the concave-convex pattern formation area of the mold 17 to match the shape of a short area (a pattern area) of the substrate 18 by applying force and displacing the four lateral sides of the outer peripheral portion of the mold 17.

The substrate holding unit 11 is a unit that holds the substrate 18 and that corrects (positions) the translational shifting of the substrate 18 and the mold 17 when the pattern is formed. The substrate holding unit 11 includes a substrate stage 13 (a moving unit) including a substrate chuck 12 (a substrate holding unit).

The substrate chuck 12 holds the substrate 18 with a substrate suction pad (substrate suction unit). Note that vacuum suction, electrostatic attraction, and other suction methods may be used as the suction method. Furthermore, the suction area of the substrate chuck 12 is separated into a plurality of partial areas, and the suction forces of the plurality of partial areas can be adjusted independently.

The substrate stage 13 is a driving system that drives in the X-axis direction and the Y-axis direction to correct (position) the translational shifting of the substrate 18 and the mold 17. Furthermore, the driving system that drives in the X-axis direction and the Y-axis direction may include a plurality of driving systems, such as a coarse motion driving system and a fine motion driving system. Furthermore, the driving system may include a driving system for adjusting the position in the Z-axis direction and may have a function of adjusting the position of the substrate 18 in the direction θ (rotating about the Z-axis) and a tilt function for correcting the inclination of the substrate 18. Furthermore, the substrate stage 13 holds the substrate chuck 12 thereto with a substrate chuck suction pad (a substrate chuck suction unit) so that the substrate chuck 12 can be, for example, cleaned and replaced. Note that vacuum suction, electrostatic attraction, and other suction methods may be used as the suction method. Note that the substrate chuck 12 is fixed by being abutted in a mechanical manner and there are cases in which the substrate stage 13 and the substrate chuck 12 positionally deviate from each other when they substrate chuck 12 is detached for, for example, cleaning and replacement.

The resin coating unit 14 is a unit for coating resin on the substrate 18. The resin coating unit 14 includes a resin injection nozzle (not shown), and resin 15 is dropped on the substrate 18 from the resin ejection nozzle. Note that a resin that has a characteristic of being cured when irradiated with an ultraviolet Ray is used. Furthermore, the amount of resin ejected may be determined based on the required resin thickness and the density of the formed pattern.

The alignment measuring unit 16 is a measurement unit that measures the positional deviation between the substrate pattern (not shown) and the mold pattern (not shown) in the X-axis direction and the Y-axis direction and the shape difference between the substrate pattern and the mold pattern by using alignment marks formed on the substrate 18 and the mold 17.

The control unit 10 is a control member that controls, for example, the operation and adjustment of each unit configuring the imprint device 1. For example, the control unit 10 is constituted by a computer and the like, and may be connected to each unit configuring the imprint device 1 through circuits and may be capable of executing a control of each unit according to a program. The control unit 10 controls the mold stage 8 and the mold-shape correction mechanisms 9 included in the mold holding unit 6, the substrate stage 13 included in the substrate holding unit 11, and a conveyance arm 24 (a conveying unit, a substrate conveying device) described later.

An image acquisition device 19 (an acquisition unit) acquires an image including an area in which the mold 17 and the resin 15 on the substrate 18 are in contact with each other. The image acquisition device 19 is positioned above the mold holding unit 6, in other words, the image acquisition device 19 is positioned upstream in the direction in which the ultraviolet ray 3 is projected. The image acquisition device 19 is an image pickup device such as, for example, a CCD camera and obtains image information of the relevant area. The image acquisition device 19 also acquires image of the area including the substrate 18 and the substrate chuck 12. Note that another image acquisition device other than the image acquisition device 19 may be configured so as to acquire the image.

A processor device 20 (a processor unit) processes the image and detects the position of the object on the image. The image acquired by the image acquisition device 19 is processed by the processor device 20 such that the state of the area in which the mold 17 and the resin 15 on the substrate 18 are in contact with each other is detected. Furthermore, the processor device 20 detects the position of each of the substrate 18 and the substrate chuck 12 and obtains the amount of positional deviation of the substrate 18 with respect to the substrate chuck 12. Note that another image processor device other than the processor device 20 may be configured so as to obtain the amount of positional deviation. Furthermore, a sensor (a distance sensor) that measures the distance to the substrate 18 and to the substrate chuck 12 may be provided in order to obtain the amount of positional deviation between the substrate chuck 12 and the substrate 18.

The imprint device 1 may include a mold conveying mechanism that conveys the mold 17 from a portion outside the device to the mold holding unit 6.

The imprint device 1 includes a base platen 21 that holds the substrate holding unit 11, a bridge platen 22 that holds the mold holding unit 6, and a support 23 that supports the bridge platen 22.

Figure 2A:
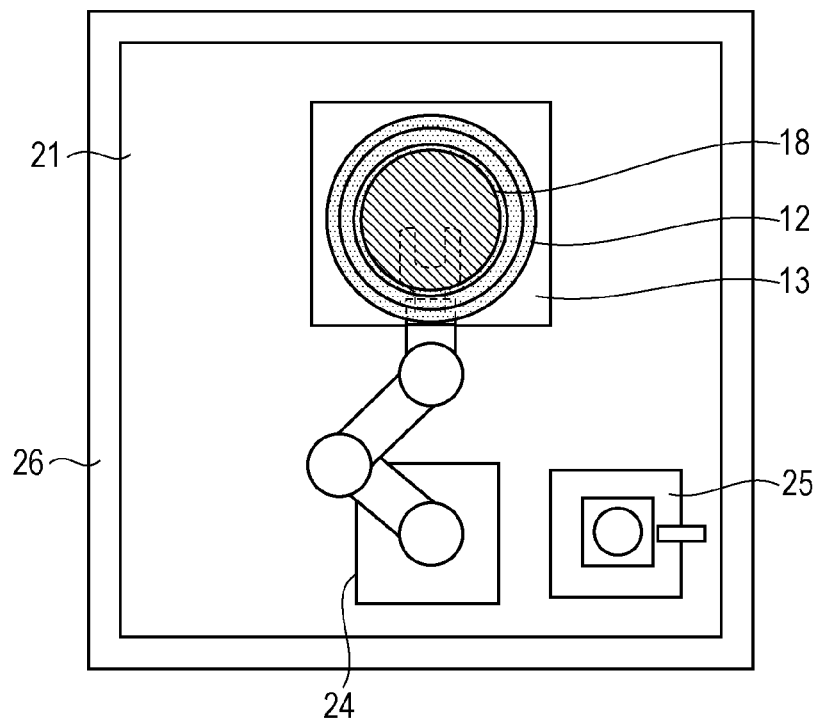
FIGS. 2A and 2B are diagrams illustrating exemplary configurations of a conveyance arm, a substrate positioning unit, a substrate stage, and the like according to the first exemplary embodiment.
Figure 2B:
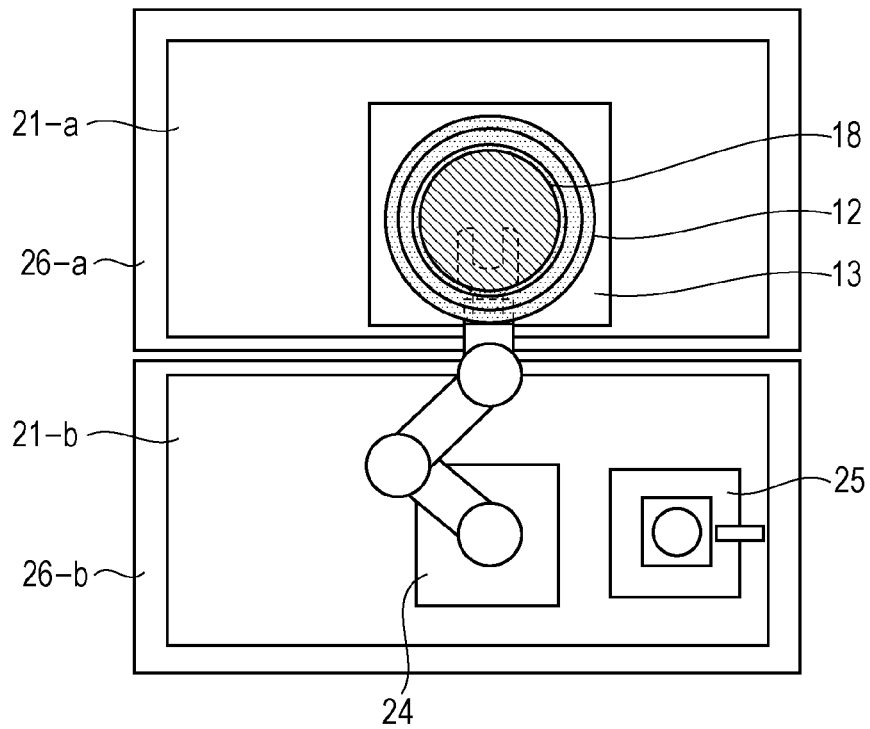

FIGS. 2A and 2B are diagrams illustrating exemplary configurations of the conveyance arm, a substrate positioning unit, the substrate stage, and the like according to the first exemplary embodiment.

In the example in FIG. 2A, the substrate stage 13, the conveyance arm 24, and a substrate positioning unit 25 are disposed on the base platen 21 fixed to a pedestal 26, and the substrate chuck 12 is disposed on the substrate stage 13. Note that a pedestal is a sectional floor on which devices are disposed and includes, as an example, a metal or concrete foundation bed-shaped structure. Furthermore, the base platen 21 is a platen that supports the substrate stage 13, the conveyance arm 24, and the substrate positioning unit 25. The substrate 18 that has been conveyed by an inline station (not shown) that transfers the substrate between the interior and the exterior of the imprint device 1 is acquired with the conveyance arm 24 and is conveyed to the substrate positioning unit 25. The substrate 18 that has been positioned with the substrate positioning unit 25 is acquired with the conveyance arm 24 and is conveyed to the substrate chuck 12. In the above, the substrate chuck 12 is suctioned by and attached to the substrate stage 13, as described above, and there are cases in which the substrate stage 13 and the substrate chuck 12 become positionally deviated from each other.

In the example in FIG. 2B, the base platen 21 is separated into a stage platen 21-a (a first platen) and a substrate conveyance platen 21-b (a second platen). The stage platen 21-a is a platen that supports the substrate stage 13, and the substrate conveyance platen 21-b is a platen that supports the conveyance arm 24 and the substrate positioning unit 25. Furthermore, the pedestal 26 is separated into a stage platen pedestal 26-a and a substrate conveyance platen pedestal 26-b. The stage platen 21-a is fixed to the stage platen pedestal 26-a, and the substrate conveyance platen 21-b is fixed to the substrate conveyance platen pedestal 26-b. Note that when the size of the device structure is large, it is difficult to fix the stage platen 21-a and the substrate conveyance platen 21-b by mechanical abutment. Accordingly, a different pedestal is fixed to each of the platens, and the platens need to be positionally adjusted with respect each other when assembling the device. Furthermore, even if the positions are adjusted, there are cases in which the stage platen 21-a and the substrate conveyance platen 21-b are positionally deviated from each other due to changes in the platens and the pedestals in the course of time, vibration caused by the drive of the actuator (not shown), and the like.

Figure 3:
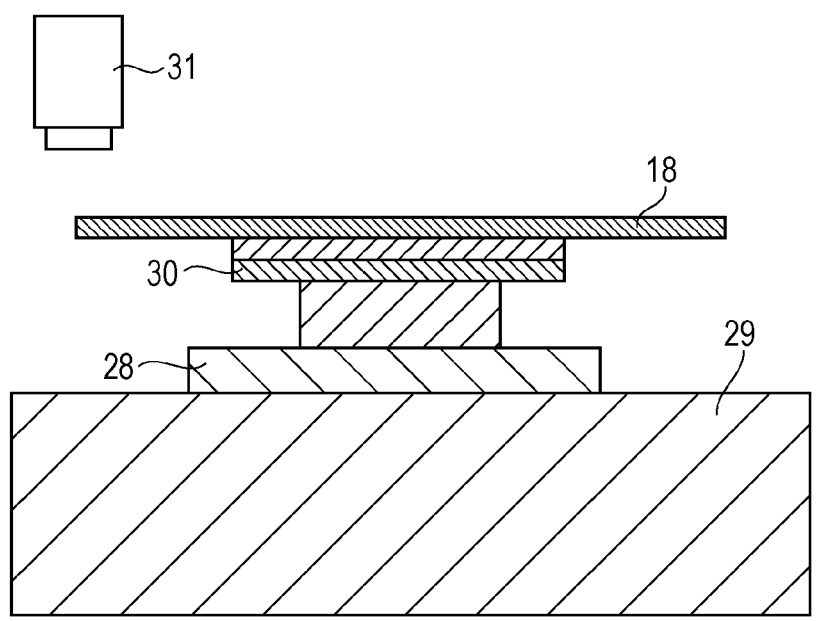
FIG. 3 is a diagram illustrating an exemplary configuration of the substrate positioning unit according to the first exemplary embodiment.

FIG. 3 is a diagram illustrator an exemplary configuration of the substrate positioning unit according to the first exemplary embodiment. The substrate positioning unit 25 includes a drive stage 28, a support 29, a substrate holding mechanism 30, and a measurement device 31. The drive stage 28 includes a drive mechanism (not shown) for driving in the X and Y directions and in the rotational direction θ. The support 29 supports the drive stage 28. The substrate holding mechanism 30 supports the substrate 18. The measurement device 31 is disposed at a position for measuring the end face of the substrate 18. The substrate 18 that has been, by the conveyance arm 24, placed on the substrate holding mechanism 30 configured on the drive stage 28 is held on the substrate holding mechanism 30 by a substrate suction pad. Note that vacuum suction, electrostatic attraction, and other suction methods may be used as the suction method. The position of the substrate is detected by rotating the drive stage 28 and measuring the end face of the substrate 18 with the measurement device 31. The image acquired by the measurement device 31 is processed as data on positional information with the image processor device, and the center position of the substrate 18 is obtained. Note that the image processor device may be configured as a device that is the same as the processor device 20. With the obtained positional information of the substrate 18, the drive stage 28 is moved in the X and Y directions and is rotated in the θ direction to position the substrate.

Figure 4A:
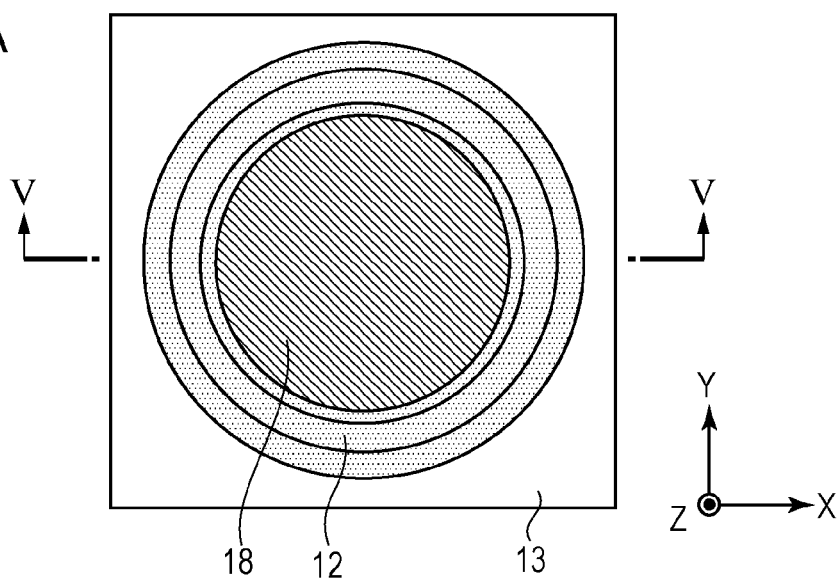
FIGS. 4A and 4B are diagrams each exemplifying an upper surface of the substrate chuck and the like according to the first exemplary embodiment.
Figure 4B:
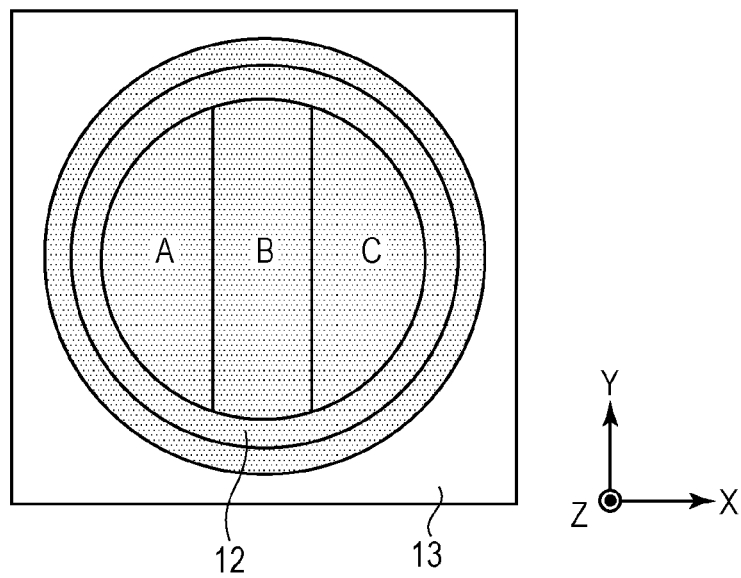

FIGS. 4A and 4B are diagrams exemplifying an upper surface of the substrate chuck and the like according to the first exemplary embodiment. FIG. 4A is a diagram of the substrate stage 13, the substrate chuck 12, and the substrate 18 viewed from above. After being positioned by the substrate positioning unit 25, the substrate 18 is, with the conveyance arm 24, loaded on the substrate chuck 12 configured on the substrate stage 13.

FIG. 4B illustrates a configuration in which the suction area of the substrate chuck 12 that is configured on the substrate stage 13 is divided. As described above, the substrate chuck 12 suctions the substrate using the substrate suction pad to hold the substrate. As in FIG. 4B, the suction area of the substrate chuck 12 is divided into three areas A, B, and C, and the suction force of each area can be individually adjusted and set. As above, by dividing the suction area of the substrate chuck 12, the substrate 18 can be held with different suction forces as required. When releasing the mold, the suction force of the suction area that suctions the portion of the substrate back side that corresponds to the shot area in which the pattern is formed and that corresponds to the area around the shot area are weakened while the suction force of the suction areas that suction the portions of the substrate back side corresponding to the plurality of shot areas other than the shot area is not weakened. With the above, releasing can be performed while the substrate 18 is deformed in an upwardly convex manner. Furthermore, the number and shape of the divided suction areas is not limited to those illustrated in the example in FIG. 4B and may be set optionally. Furthermore, when releasing the mold, by deforming the mold 17 in a downwardly convex manner at the same time as the deformation of the substrate 18 in the upwardly convex manner, tilting of the resin pattern can be reduced.

Figure 5A:
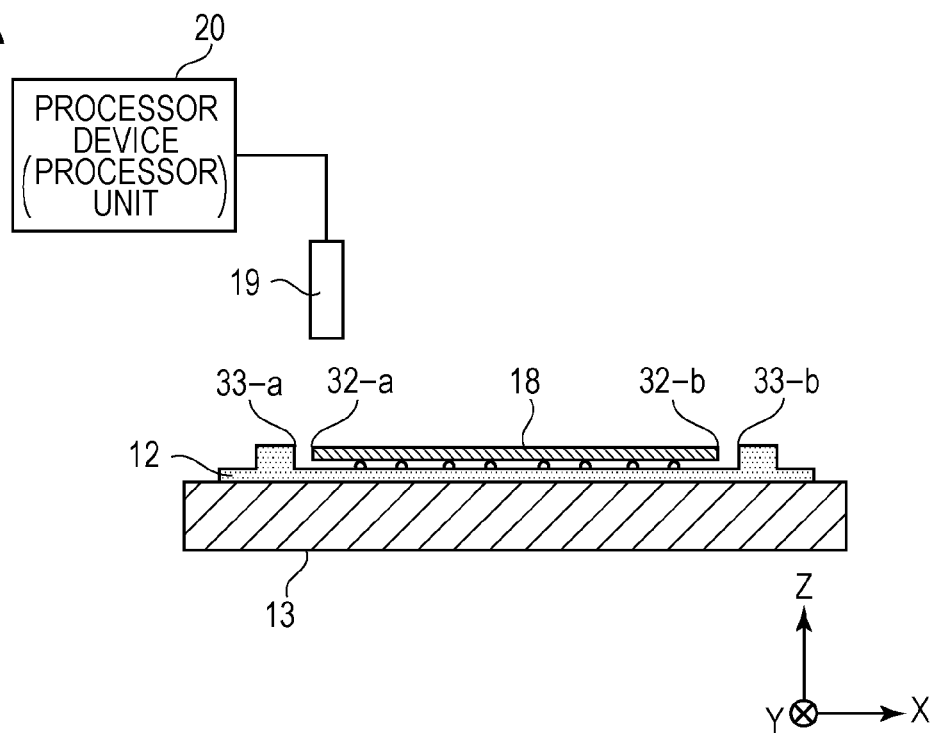
FIGS. 5A and 5B are diagrams exemplifying cross-sections of the substrate chuck and the like according to the first exemplary embodiment.
Figure 5B:
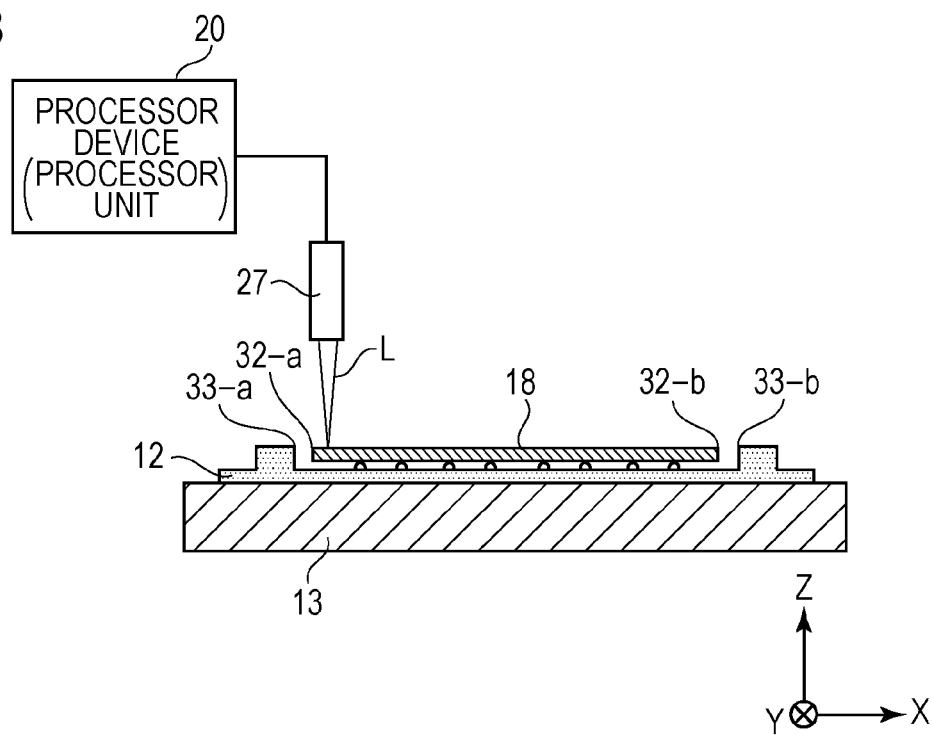

FIGS. 5A and 5B are diagrams exemplifying cross sections of the substrate chuck and the like according to the first exemplary embodiment. FIGS. 5A and 5B are cross-sectional views of the substrate stage 13, the substrate chuck 12, the substrate 18, and the like taken along line V-V in FIG. 4A.

In the example in FIG. 5A, a substrate end portion 32 is an outer peripheral portion of the substrate 18 that has been conveyed on the substrate chuck 12 with the conveyance arm 24. Note that instead of the substrate end portion 32, an orientation flat of the substrate 18, a notch, an inclined portion near the end portion, or a portion (a predetermined region) having another three-dimensional shape, which has a fixed distance from the center position of the substrate 18, may be used. Furthermore, an arc, a straight line, or another portion (a predetermined region) of a planar figure on the substrate 18, which has a fixed distance from the center position of the substrate 18, may be used.

An inner peripheral portion 33 is an inner peripheral portion of an annular protrusion formed in the substrate chuck 12. Note that the inner peripheral portion 33 of the protrusion has an arc shape in which the center point thereof is the center of the substrate chuck 12 when viewed from above. Furthermore, instead of the inner peripheral portion 33 of the protrusion, an outer peripheral portion of the protrusion, the outermost peripheral portion of the substrate chuck 12, or a portion (a predetermined region) having another three-dimensional shape, which has a fixed distance from the center position of the substrate chuck 12, may be used. Alternatively, an arc, a straight line, or another portion (a predetermined region) of a planar figure on the substrate chuck 12, which has a fixed distance from the center position of the substrate chuck 12, may be used.

When the substrate 18 is suctioned with a suction mechanism (not shown) of the substrate chuck 12, the image acquisition device 19 acquires an image including the substrate end portion 32 and the inner peripheral portion 33 of the protrusion of the substrate chuck 12 as measurement data representing the positional relationship between the substrate 18 and the substrate chuck 12.

The processor device 20 detects the positions of the substrate end portion 32 and the inner peripheral portion 33 of the protrusion from the acquired image and obtains the amount of positional deviation. The processor device 20 performs, image processing, such as HDR processing, Hough transformation, or the like, on the image acquired with the CCD, for example, and detects the positions of the substrate end portion 32 and the inner peripheral portion 33 of the protrusion. The amount of positional deviation between the center positions of the substrate 18 and the substrate chuck 12 is obtained from the detected positions.

From the amount of positional deviation, a driving amount calculation device (not shown) obtains the correction amount of the driving amount for matching the center positions. When the substrate 18 that is to be conveyed onto the substrate chuck 12 with the conveyance arm 24 is conveyed, the driving amount calculation device obtains the correction amount for correcting the position of either one of the conveyance arm 24 and the substrate stage 13 or the correction amounts of the positions of both the conveyance arm 24 and the substrate stage 13. Note that the driving amount calculation device may be configured as a device that is the same as the control unit 10.

Based on the correction amount, the control unit 10 controls either one or both of the conveyance arm 24 and the substrate stage 13. Furthermore, the position of the substrate 18 may be corrected with the substrate positioning unit 25 on the basis of the correction amount.

The example in FIG. 5B includes a distance sensor 27 that detects the positions of the substrate end portion 32 and the inner peripheral portion 33 of the protrusion of the substrate chuck 12. The distance sensor 27 projects light L from the light source and receives the light L reflected from the object to measure the distance to the object. While moving at a constant speed, the distance sensor 27 measures the distances to the substrate 18 and the substrate chuck 12 at a constant periodic interval. Note that the distance sensor 27 maybe a distance sensor that employs an ultrasonic system or other systems other than the optical system. The data of the distances (distance data) at each periodic interval is acquired as measurement data representing the positional relationship between the substrate 18 and the substrate chuck 12. From the acquired pieces of changing distance data, the processor device 20 detects the time when the distance sensor 27 passes the substrate end portion 32 and the inner peripheral portion 33 of the protrusion, and from the detected time and the speed, the distance between the substrate end portion 32 and the inner peripheral portion 33 of the protrusion is obtained. Note that instead of the substrate end portion 32, an orientation flat of the substrate 18, a notch, an inclined portion near the end portion, or a portion (a predetermined region) having another three-dimensional shape, which has a fixed distance from the center position of the substrate 18, may be used. Furthermore, instead of the inner peripheral portion 33 of the protrusion, the outer peripheral portion of the protrusion of the substrate chuck 12, the outermost peripheral portion of the substrate chuck 12, or a portion (a predetermined region) having another three-dimensional shape, which has a fixed distance from the center position of the substrate chuck 12, may be used. Furthermore, distance data of a predetermined region between the substrate 18 and the substrate chuck 12 may be acquired.

Figure 6:
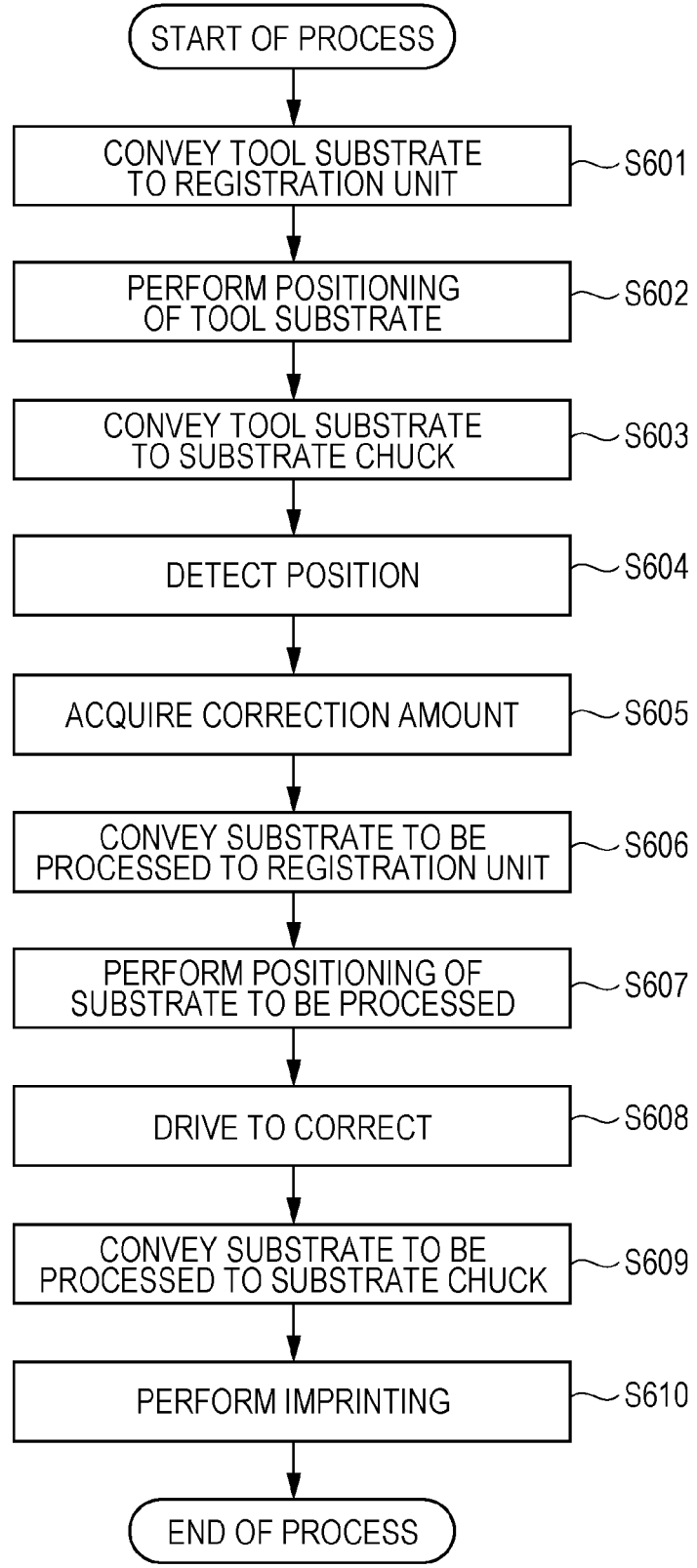
FIG. 6 is a diagram exemplifying a flow from conveyance to the positioning unit to imprinting, according to the first exemplary embodiment.

FIG. 6 is a diagram exemplifying a flow from the conveyance to the positioning unit to the imprinting, according to the first exemplary embodiment. In S601, the tool substrate is conveyed to the substrate positioning unit 25 with the conveyance arm 24. In S602, positioning of the tool substrate is performed with the substrate positioning unit 25. In the above, a dedicated substrate having a high dimensional accuracy may be used as the tool substrate or the substrate used as the substrate to be processed may be used. In S603, the tool substrate is acquired with the conveyance arm 24 and is conveyed to the substrate chuck 12 on the substrate stage 13. In S604, images of the substrate end portion 32 and the inner peripheral portion 33 of the protrusion are acquired with the image acquisition device 19 and the positions of the substrate end portion 32 and the inner peripheral portion 33 of the protrusion of the substrate chuck 12 are detected with the processor device 20. Note that when the amount of positional deviation between the substrate 18 and the substrate chuck 12 is large and the positions of the substrate end portion 32 and the inner peripheral portion 33 of the protrusion cannot be detected, the substrate 18 may be conveyed to the positioning unit and positioning may be performed once more. Alternatively, it may be determined that the amount of positional deviation is large and adjustment of the device is needed, and the process may be stopped. In S605, the amount of positional deviation between the substrate 18 and the substrate chuck 12 is obtained from the positions of the substrate end portion 32 and the inner peripheral portion 33 of the protrusion, and from the deviation amount, the correction amount is obtained. Note that a method for obtaining the correction amount will be described later. Furthermore, subsequently, until the substrate to be processed is conveyed to the substrate stage 13, the tool substrate is conveyed out with the conveyance arm 24 (not shown). Alternatively, the process from S601 to S605 may be performed repeatedly to obtain a plurality of correction amounts, and the correction amount may be the mean value of the plurality of correction amounts, the intermediate value of the plurality of correction amounts, or a value obtained by applying a statistical method to the plurality of correction amounts. In S606, the substrate to be processed is conveyed to the substrate positioning unit 25 with the conveyance arm 24. In S607, positioning of the substrate to be processed is performed with the substrate positioning unit 25. In S608, the conveyance arm 24 or the substrate stage 13 is driven to perform positioning on the basis of the correction amount obtained in S605. In S609, the substrate to be processed is acquired with the conveyance arm 24 and is conveyed to the substrate chuck 12 on the substrate stage 13. Note that the driving of the conveyance arm 24 or the substrate state 13 using the correction value to perform positioning in S608 may be performed in S609 while the substrate to be processed is conveyed. In S610, imprinting that forms a pattern on the substrate to be processed is performed.

Referring to FIGS. 7 to 13, detection of the positions of the substrate end portion 32 and the inner peripheral portion 33 of the protrusion of the substrate chuck 12 in S604, and acquisition of the correction amount in S605 will be described.

Figure 7A:
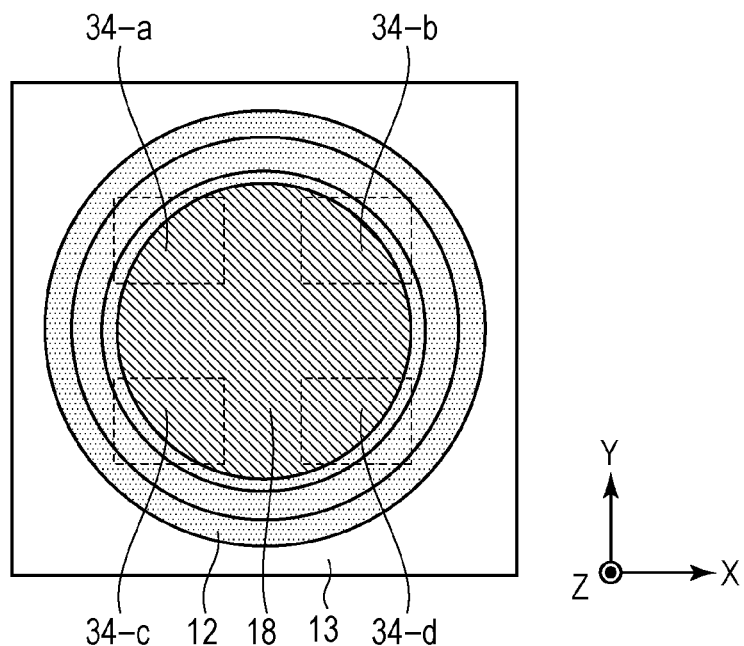
FIGS. 7A and 7B are diagrams exemplifying the substrate stage, the substrate chuck, and a measurement area, according to the first exemplary embodiment.
Figure 7B:
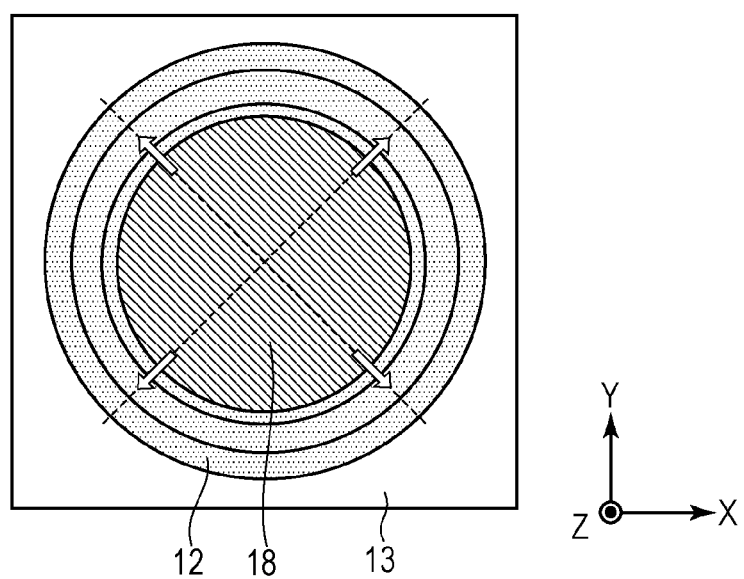

FIGS. 7A and 7B are diagrams exemplifying the substrate stage, the substrate chuck, and the measurement area, according to the first exemplary embodiment. In the example in FIG. 7A, an image of the substrate end portion 32 of the substrate 18 and the inner peripheral portion 33 of the protrusion of the substrate chuck 12 is acquired with the image acquisition device 19. The portion measured with the image acquisition device 19 is referred to as a measurement area 34. The measurement area 34 is an area having a range allowing measurement of substrate end portion 32 and the inner peripheral portion 33 of the protrusion to be measured at the same time. In the example in FIG. 7A, four measurement areas 34 are illustrated in which two pairs of measurement areas, each pair being symmetrically positioned with respect to a center point of the inner peripheral portion 33 of the protrusion of the substrate chuck 12, are disposed. Note that the number and the positions of the measurement areas in which the images are obtained are not limited to the illustrated numbers and positions. The numbers and the positions of the measurement areas in which the images are acquired with the image acquisition device 19 may be allowed to be changed by having the user input the numbers and positions of the measurement areas through a console screen (not shown) of the imprint device and by saving the numbers and positions of the measurement areas in a storage unit (not shown) of the control unit 10.

In the example in FIG. 7B, the distances to the substrate 18 and the substrate chuck 12 are measured while the distance sensor 27 moves at a constant speed. The arrows in the drawing indicates the positions in which the distance sensor 27 starts the measurement or the positions in which the measurement are ended, in other words, the arrows indicate the measurement area of the distance sensor 27. Note that the number and the positions of the measurement areas are not limited to the illustrated numbers and positions. The numbers and the positions of the measurement areas in which the distance sensor 27 measures may be allowed to be changed by having the user input the numbers and positions of the measurement areas through a console screen (not shown) of the imprint device and by saving the numbers and positions of the measurement areas in a storage unit (not shown) of the control unit 10.

Figure 8:
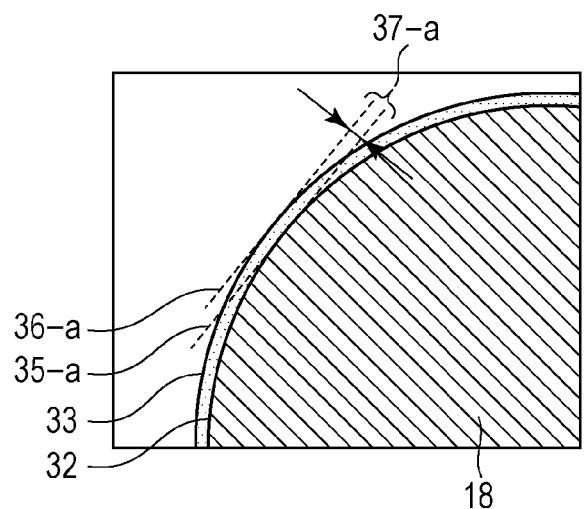
FIG. 8 is a diagram exemplifying an enlarged view of an image of a measurement area 34-*a* and a tangential line, according to the first exemplary embodiment.

FIG. 8 is a diagram exemplifying an image of a measurement area 34-a according to the first exemplary embodiment. The arcs of the substrate end portion 32 and the inner peripheral portion 33 of the protrusion of the substrate chuck 12 are detected in the processor device 20 with the image acquired by the image acquisition device 19 by using a method of detecting the arcs such as, for example, Hough transformation. The amount of positional deviation between the center point of the arc of the substrate end portion 32 and the center point of the arc of the inner peripheral portion 33 of the protrusion is obtained, and the correction amount of driving to match the center positions of the substrate 18 and the substrate chuck 12 to each other is obtained with the amount of positional deviation. Furthermore, the correction amount may be a mean value of a plurality of correction amounts obtained from the images of the plurality of measurement areas, the intermediate value of the plurality of correction amounts, or a value obtained by applying a statistical method to the plurality of correction amounts.

Furthermore, the arcs of the substrate end portion 32 and the inner peripheral portion 33 of the protrusion of the substrate chuck 12 may be detected from the images of the four measurement areas, and the correction amount may be obtained from the distance between tangential lines of the arcs of the substrate end portion 32 and the inner peripheral portion 33 of the protrusion. In FIG. 8, a tangential line 35-$a$ that passes through an optional point on the arc of the substrate end portion 32 and that is tangent to the arc of the substrate end portion 32 is determined first. Subsequently, a tangential line 36-$a$ that is tangent to the arc of the inner peripheral portion 33 of the protrusion and that is parallel to the tangential line 35-$a$ is determined. Subsequently, a distance 37-$a$ between the tangential line 35-$a$ and the tangential line 36-$a$ is obtained. Note that when the distance sensor 27 is used, the distance 37-$a$ is measured directly. The same applies to a distance 37-$b$, a distance 37-$c$, and a distance 37-$d$ that are described later.

Figure 9:
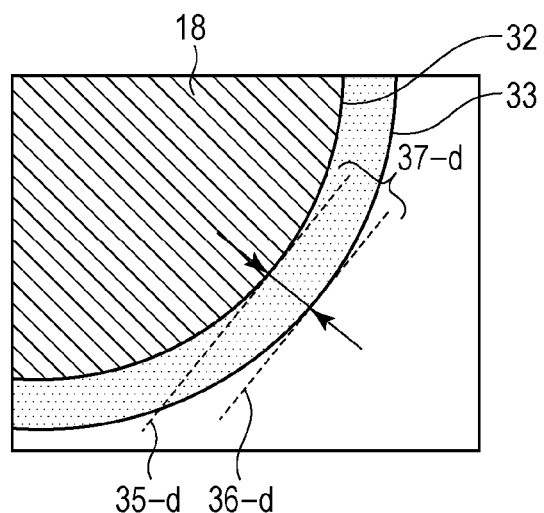
FIG. 9 is a diagram exemplifying an enlarged view of an image of a measurement area 34-*d* and a tangential line, according to the first exemplary embodiment.

FIG. 9 is a diagram exemplifying an enlarged view of an image of a measurement area 34-$d$ according to the first exemplary embodiment. The measurement area 34-$d$ is disposed at a position symmetrical to the position of the measurement area 34-$a$ with respect to a center point of the inner peripheral portion 33 of the protrusion. As regards the measurement area 34-$d$, arcs of the substrate end portion 32 and the inner peripheral portion 33 of the protrusion are detected from the images acquired by the image acquisition device 19. Subsequently, a tangential line 35-$d$ of the substrate end portion 32 and a tangential line 36-$d$ of the inner peripheral portion 33 of the protrusion that are parallel to the tangential line 35-$a$ and the tangential line 36-$a$ are determined, and the distance 37-$d$ between the tangential line 35-$d$ and the tangential line 36-$d$ is obtained. Subsequently, from the difference between the distance 37-$a$ and the distance 37-$d$, an amount of positional deviation S–1 between the substrate end portion 32 and the inner peripheral portion 33 of the protrusion in the direction orthogonal to the tangential line 35-$a$ is obtained.

Figure 10:
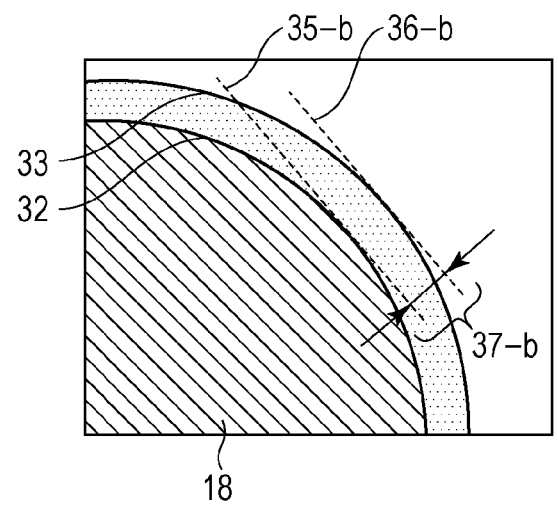
FIG. 10 is a diagram exemplifying an enlarged view of an image of a measurement area 34-*b* and a tangential line, according to the first exemplary embodiment.
Figure 11:
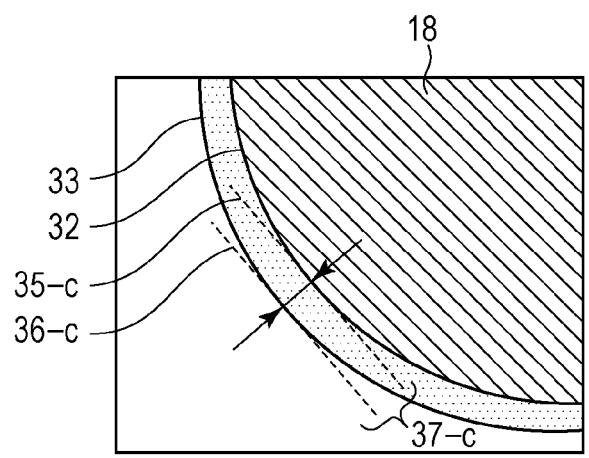
FIG. 11 is a diagram exemplifying an enlarged view of an image of a measurement area 34-*c* and a tangential line, according to the first exemplary embodiment.

FIG. 10 is a diagram exemplifying an enlarged view of an image of a measurement area 34-$b$ according to the first exemplary embodiment. Furthermore, FIG. 11 is a diagram exemplifying an enlarged view of an image of a measurement area 34-$c$ according to the first exemplary embodiment. In a similar manner to the above, a tangential line 35-$b$ and a tangential line 36-$b$ are determined from the image of the measurement area 34-$b$, and a distance 37-$b$ is obtained, and a tangential line 35-$c$ and a tangential line 36-$c$ are determined from the image of the measurement area 34-$c$, and a distance 37-$c$ is obtained. Subsequently, from the difference between the distance 37-$b$ and the distance 37-$c$, an amount of positional deviation S–2 between the substrate end portion 32 and the inner peripheral portion 33 of the protrusion in the direction orthogonal to the tangential line 35-$b$ is obtained.

Furthermore, an amount of positional deviation S can be obtained by synthesizing the amount of positional deviation S–1 related to the direction orthogonal to the tangential line 35-$a$ and the amount of positional deviation S–2 related to the direction orthogonal to the tangential line 35-$b$. Accordingly, the correction amount of driving to match the center positions of the substrate 18 and the substrate chuck 12 to each other is obtained with the amount of positional deviation S.

In the above method, the shape of the substrate chuck 12 is not limited to a shape having an arc shape but may be a polygonal shape such as a rectangular shape that has sides that have a fixed distance from the center position of the substrate chuck 12. Furthermore, not only the inner peripheral portion 33 of the protrusion of the substrate chuck 12 that is a portion (a predetermined region) having an arc shape, a portion (a predetermined region) of the substrate chuck 12 having a straight shape, which has a fixed distance from the center position of the substrate chuck 12, may be used. In such a case, instead of the tangential line of the arc of the substrate chuck 12, the correction amount may be obtained with a straight line that has a fixed distance from the center position of the substrate chuck 12.

Furthermore, the shape of the substrate 18 is also not limited to a shape having an arc shape but may be a polygonal shape such as a rectangular shape that has sides that have a fixed distance from the center position of the substrate 18. Furthermore, a portion (a predetermined region) of the substrate 18 having a straight shape, in which the distance from the center position of the substrate 18 is fixed, may be used. In such a case, instead of the tangential line of the substrate end portion 32, the correction amount may be obtained with a straight line that have a fixed distance from the center position of the substrate 18.

For example, when the shapes of the protrusion of the substrate chuck and the substrate are rectangular, the positional deviation between the substrate chuck and the substrate can be obtained from the distances between the corresponding straight lines of the four sides of each rectangular. Furthermore, when the shape of the protrusion of the substrate chuck is an arc shape and the shape of the substrate is rectangular, the positional deviation between the substrate chuck and the substrate can be obtained from the distances between each of the straight lines of the four sides of the rectangular and the corresponding one of the tangential lines of the arc of the inner peripheral portion of the protrusion of the substrate chuck that is parallel to the corresponding one of the four sides.

A method of obtaining the amount of positional deviation from intersections of perpendicular bisectors of line segments passing through points on the arcs of the substrate end portion 32 and the inner peripheral portion 33 of the protrusion of the substrate chuck 12 will be described next.

Figure 12:
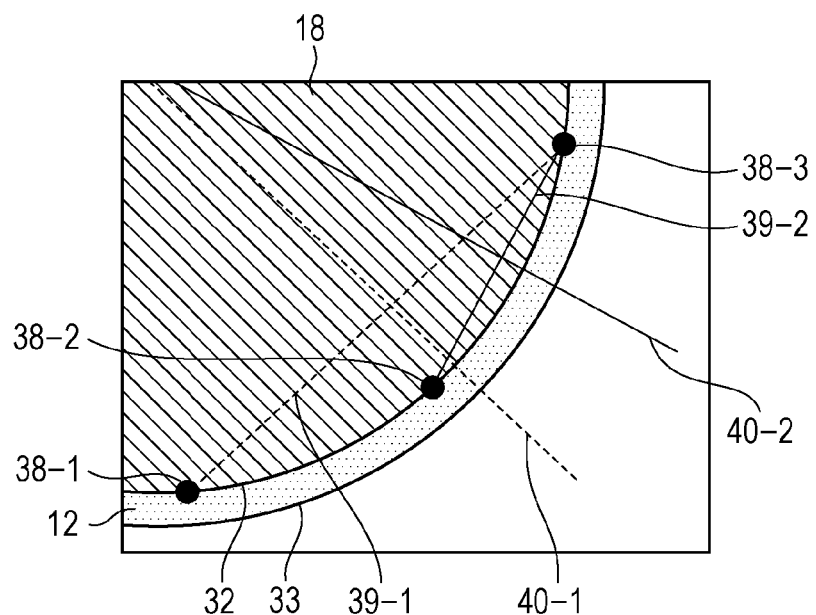
FIG. 12 is a diagram exemplifying an enlarged view of an image of the measurement area 34-*d* and perpendicular bisectors of a substrate end portion according to the first exemplary embodiment.

FIG. 12 is a diagram exemplifying an enlarged view of an image of the measurement area 34-$d$ and perpendicular bisectors of the substrate end portion according to the first exemplary embodiment. An arc of the substrate end portion 32 and three optional points 38-1, 38-2, and 38-3 on the arc is detected with the processor device 20 from the image acquired with the image acquisition device 19. A line segment 39-1 connecting the point 38-1 and the point 38-3, and a line segment 39-2 connecting the point 38-2 and the point 38-3 are determined. Perpendicular bisectors 40-1 and 40-2 of the line segments 39-1 39-2, respectively, are determined, an intersection (not shown) of the perpendicular bisectors 40-1 and 40-2 are obtained, and the intersection is determined as the position of the center point of the substrate 18.

Figure 13:
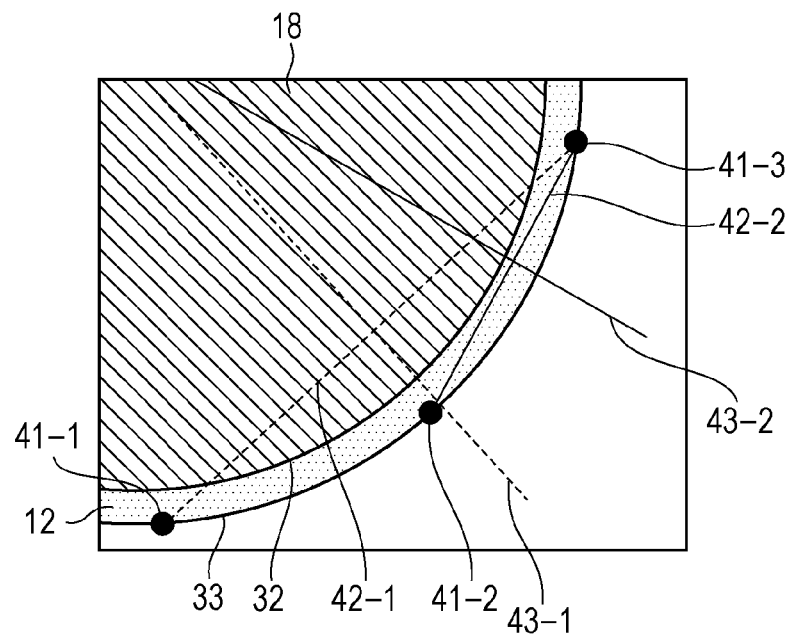
FIG. 13 is a diagram exemplifying an enlarged view of an image of the measurement area 34-*d* and perpendicular bisectors of an inner peripheral portion of a protrusion of the substrate chuck according to the first exemplary embodiment.

FIG. 13 is a diagram exemplifying an enlarged view of an image of the measurement area 34-*d* and perpendicular bisectors of the inner peripheral portion of the protrusion of the substrate chuck according to the first exemplary embodiment. An arc of the inner peripheral portion 33 and three optional points 41-1, 41-2, and 41-3 on the arc is detected with the processor device 20 from the image acquired with the image acquisition device 19. A line segment 42-1 connecting the point 41-1 and the point 41-3, and a line segment 42-2 connecting the point 41-2 and the point 41-3 are determined. Perpendicular bisectors 43-1 and 43-2 of the line segments 42-1 42-2, respectively, are determined, an intersection (not shown) of the perpendicular bisectors 43-1 and 43-2 are obtained, and the intersection is determined as the position of the center point of the substrate 12. The amount of positional deviation S between the center point of the substrate 18 and the center point of the substrate chuck 12 is obtained, and the correction amount of driving to match the center positions of the substrate 18 and the substrate chuck 12 to each other is obtained with the amount of positional deviation S. With the above method, the correction amount can be obtained from a single image of the measurement area. Furthermore, the correction amount can be obtained from a mean value of a plurality of correction amounts that have been obtained through images of a plurality of measurement areas.

As described above, the correction amount can be obtained from either of the methods. The conveyance arm 24 or the substrate stage 13 is driven next by the driving amount that has been corrected using the correction amount, before or while the substrate 18 is conveyed to the substrate chuck 12. With the above, when the conveyance arm 24 is conveying the substrate 18 to the substrate chuck 12, the conveyance arm 24 is capable of conveying the substrate 18 to the position corrected by the amount of positional deviation S.

While various modes of the first exemplary embodiment have been described above, not limited to the various modes, various deformation and modification thereof can be made within the gist thereof.

Accordingly, the imprint device according to the first exemplary embodiment is capable of performing accurate positioning of the substrate 18 with respect to the substrate chuck 12 by obtaining the correction amount for positioning the substrate 18 with respect to the substrate chuck 12 from measurement data of the area including the substrate 18 and the substrate chuck 12.

Second Exemplary Embodiment

Figure 14:
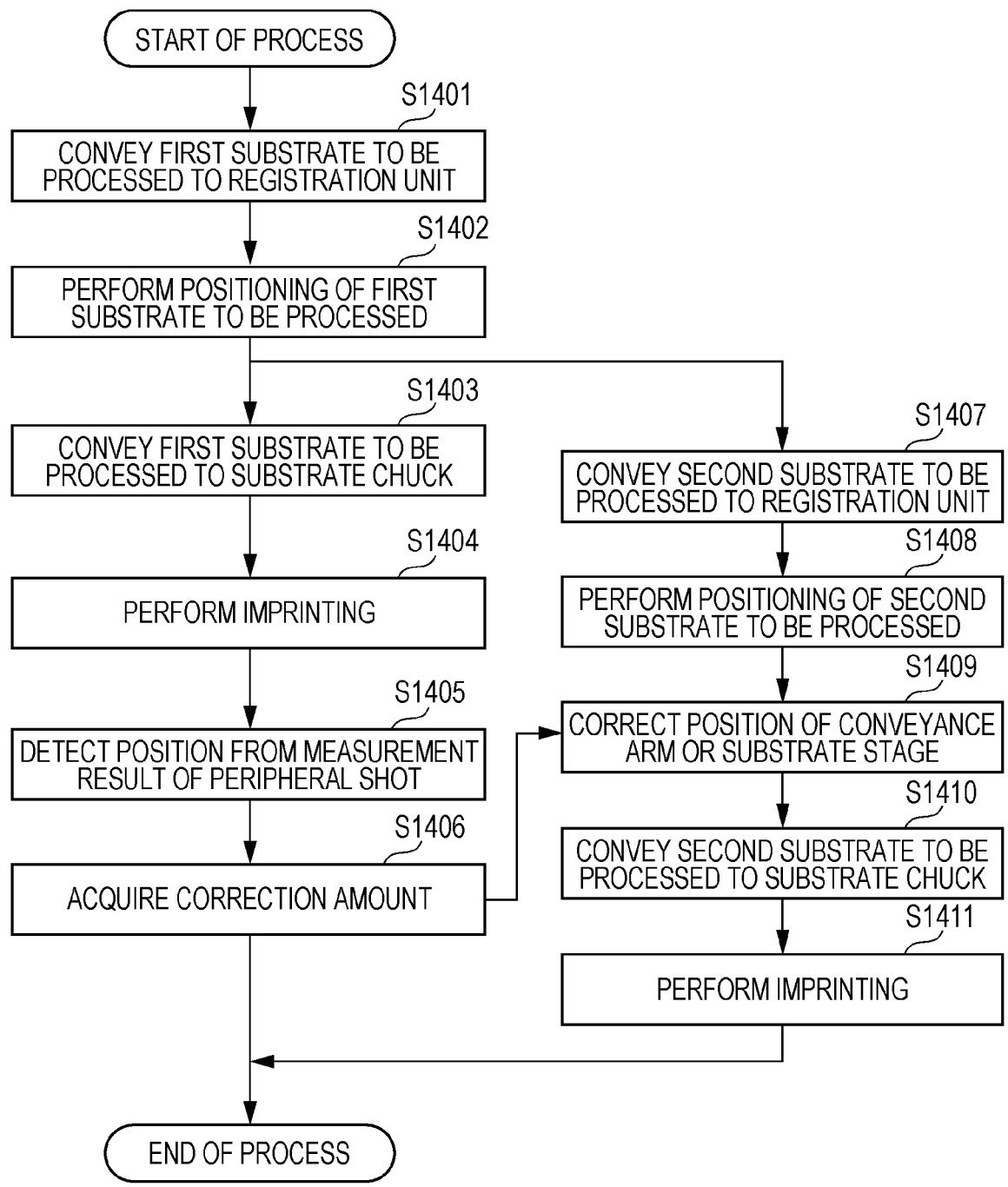
FIG. 14 is a diagram exemplifying a flow from conveyance to the positioning unit to imprinting, according to a second exemplary embodiment.
Figure 15:
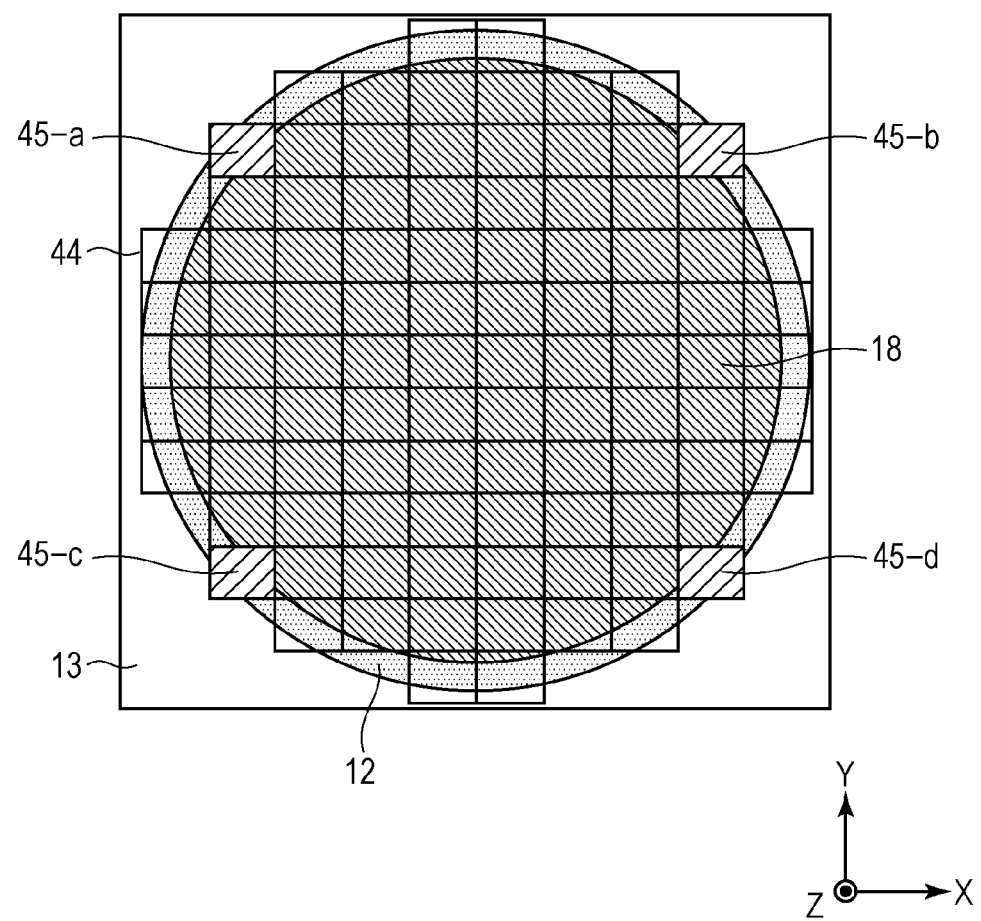
FIG. 15 is a diagram exemplifying a shot layout of a substrate to be processed according to the second exemplary embodiment.

Referring to FIGS. 14 and 15, an imprint device according to a second exemplary embodiment will be described. Note that matters that are not described herein may be the same as those described in the first exemplary embodiment.

FIG. 14 is a diagram exemplifying a flow from the conveyance to the positioning unit to the imprinting, according to the second exemplary embodiment. In S1401, a first substrate to be processed is conveyed to the substrate positioning unit 25 with the conveyance arm 24. In S1402, positioning of the first substrate to be processed is performed with the substrate positioning unit 25. In S1403, the first substrate to be processed is acquired with the conveyance arm 24 and is conveyed to the substrate chuck 12 on the substrate stage 13. In S1404, imprinting that forms a pattern on the substrate to be processed is performed. In S1405, between when imprinting is performed and when the mold release is performed, an image of the substrate end portion 32 and the inner peripheral portion 33 of the protrusion of the substrate chuck 12 is acquired with the image acquisition device 19 in order to form a pattern in the peripheral shot that is the outermost peripheral shot of the shot layout on the substrate to be processed. Subsequently, the processor device 20 detects the positions of the substrate end portion 32 and the inner peripheral portion 33 of the protrusion. In S1406, the amount of positional deviation between the center of the substrate 18 and the substrate chuck 12 is obtained from the positions of the substrate end portion 32 and the inner peripheral portion 33 of the protrusion, and from the deviation amount, the correction amount is obtained. Note that instead of the image acquisition device 19, the distance sensor 27 may be used to measure the distance data and obtain the amount of positional deviation. After the above, until a second substrate to be processed is conveyed to the substrate stage 13, imprinting of the first substrate to be processed is completed and the first substrate to be processed is conveyed out with the conveyance arm 24 (not shown). In S1407, the second substrate to be processed is conveyed to the substrate positioning unit 25 with the conveyance arm 24. In S1408, positioning of the second substrate to be processed is performed with the substrate positioning unit 25. In S1409, the conveyance arm 24 or the substrate stage 13 is driven to perform positioning on the basis of the correction amount obtained in S1406. Note that the position of the second substrate to be processed may be corrected with the substrate positioning unit 25 on the basis of the correction amount. In S1410, the second substrate to be processed is acquired with the conveyance arm 24 and is conveyed to the substrate chuck 12 on the substrate stage 13. Note that the driving of the conveyance arm 24 or the substrate state 13 using the correction value to perform positioning in S1409 may be performed in S1410 while the second substrate to be processed is conveyed. In S1411, imprinting that forms a pattern on the second substrate to be processed is performed.

FIG. 15 is a diagram exemplifying a shot layout of the substrate to be processed according to the second exemplary embodiment. The example is a typical shot layout 44 that is divided into 98 shot areas with respect to the substrate 18, and the formation of the pattern is performed in the shot areas. The pattern formation is performed in order from the upper portion to the left, for example. In the above pattern formation, while the pattern is formed in the peripheral shot, such as a peripheral shot 45-*a* on the upper left of the substrate 18, the image of the substrate end portion 32 and the inner peripheral portion 33 of the protrusion of the substrate chuck 12 is acquired with the image acquisition device 19. Subsequently, the processor device 20 detects the positions of the substrate end portion 32 and the inner peripheral portion 33 of the protrusion. Accordingly, the positions can be detected without reducing the throughput of the imprinting process. For example, the image in the peripheral shot 45-*a* on the upper left of the substrate 18 is acquired with the image acquisition device 19 before the pattern is formed. Subsequently, an image of the substrate end portion 32 and the inner peripheral portion 33 of the protrusion in a peripheral shot 45-*b* on the upper right of the substrate is acquired with the image acquisition device 19 while the pattern is formed on the substrate 18. In a similar manner, the image in a peripheral shot 45-*c* on the lower left of the substrate 18 and the image in a peripheral shot 45-*d* on the lower right thereof are acquired. The processor device 20 obtains the correction amount from the images. The method for obtaining the correction amount is as described in detail in the description of the first exemplary embodiment. Note that the number of peripheral shots and the positions thereof in which the images are acquired are not limited to the numbers and positions illustrated in the drawing and the number of peripheral shots and the positions thereof may be allowed to be changed by the user. Note that as long as the images of the substrate end portion 32 and the inner peripheral portion 33 of the protrusion can be acquired, the images may be acquired while, rather than while the outermost peripheral shot in the shot layout is formed, the pattern of the shot inside the outermost peripheral shot is formed.

While a mode of the second exemplary embodiment has been described above, not limited to the mode, various deformation and modification thereof can be made within the gist thereof.

Accordingly, the imprint device according to the second exemplary embodiment is capable of performing accurate positioning of the substrate 18 with respect to the substrate chuck 12 by obtaining the correction amount for positioning the substrate 18 with respect to the substrate chuck 12 from measurement data of the area including the substrate 18 and the substrate chuck 12. Furthermore, since the positioning of the substrate 18 with respect to the substrate chuck 12 is performed from the measurement data that has been acquired while the patterns are formed in the peripheral shots in the imprint process, positioning can be performed without reducing the throughput of the imprinting process.

Third Exemplary Embodiment

Figure 16:
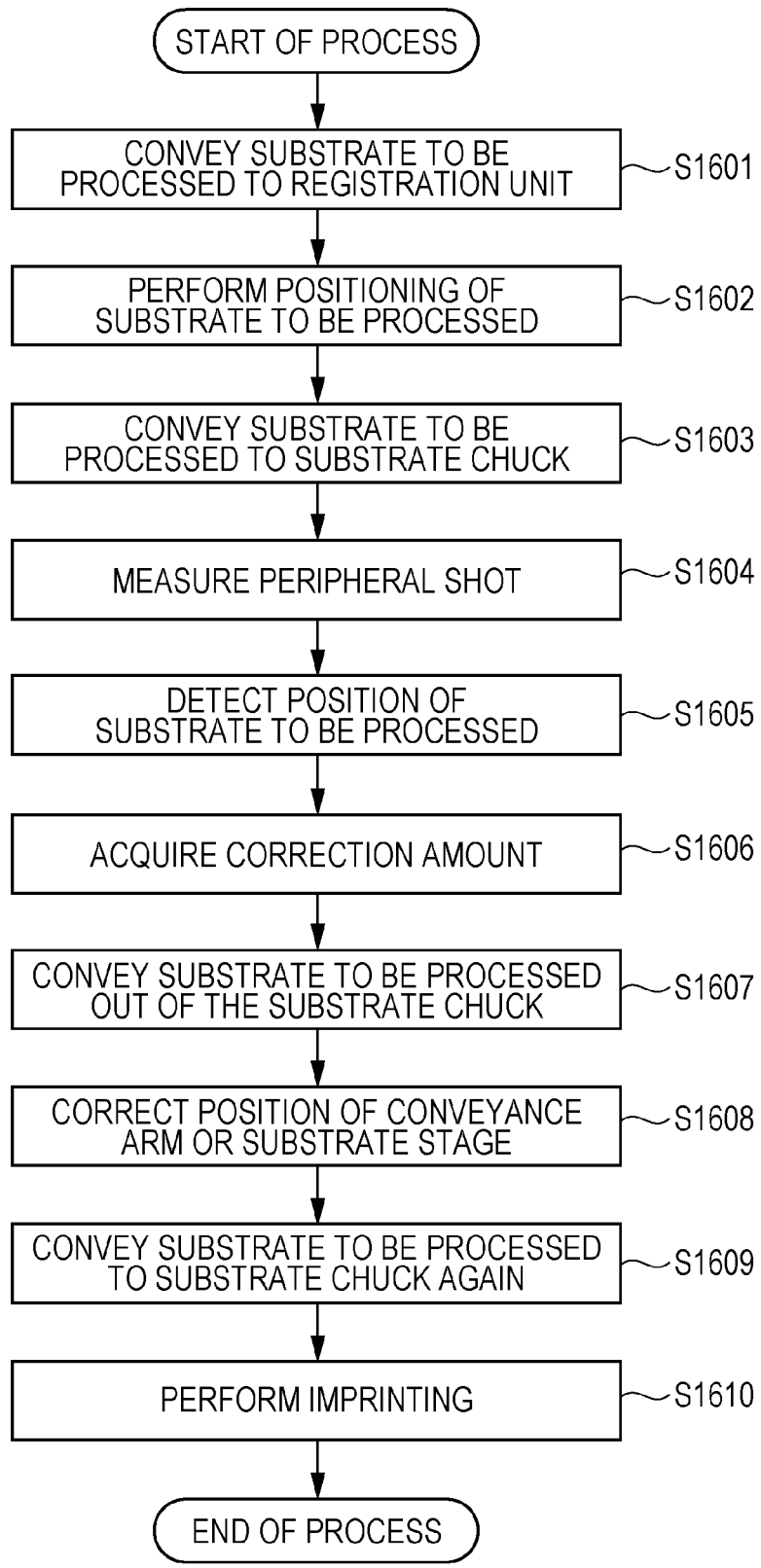
FIG. 16 is a diagram exemplifying a flow from conveyance to the positioning unit to imprinting, according to a third exemplary embodiment.

Referring to FIG. 16, an imprint device according to a third exemplary embodiment will be described. Note that matters that are not described herein may be the same as those described in the first and second exemplary embodiments.

FIG. 16 is a diagram exemplifying a flow from the conveyance to the positioning unit to the imprinting, according to the third exemplary embodiment. In S1601, the substrate to be processed is conveyed to the substrate positioning unit 25 with the conveyance arm 24. In S1602, positioning of the substrate to be processed is performed with the substrate positioning unit 25. In S1603, the substrate to be processed is acquired with the conveyance arm 24 and is conveyed to the substrate chuck 12 on the substrate stage 13. In S1604, an image of the substrate end portion 32 and the inner peripheral portion 33 of the protrusion of the substrate chuck 12 is acquired with the image acquisition device 19. In S1605, the image is processed with the processor device 20 and the positions of the substrate end portion 32 and the inner peripheral portion 33 of the protrusion are detected. In S1606, the amount of positional deviation between the center of the substrate 18 and the substrate chuck 12 is obtained from the positions of the substrate end portion 32 and the inner peripheral portion 33 of the protrusion, and from the deviation amount, the correction amount is obtained. Note that instead of the image acquisition device 19, the distance sensor 27 may be used to measure the distance data and obtain the amount of positional deviation. In S1607, the substrate to be processed is acquired with the conveyance arm 24 and is conveyed out from the substrate chuck 12 on the substrate stage 13, and the substrate to be processed is held by the conveyance arm 24. In S1608, the conveyance arm 24 or the substrate stage 13 is driven to perform positioning on the basis of the correction amount obtained in S1606. Note that the substrate to be processed may be conveyed to the substrate positioning unit 25 in S1607 and the position of the substrate to be processed may be corrected with the substrate positioning unit 25 on the basis of the correction amount. In S1609, the substrate to be processed is acquired with the conveyance arm 24 and is conveyed once more to the substrate chuck 12 on the substrate stage 13. Note that the driving of the conveyance arm 24 or the substrate state 13 using the correction value to perform positioning in S1608 may be performed in S1609 while the substrate to be processed is conveyed. In S1610, imprinting that forms a pattern on the substrate to be processed is performed.

While a mode of the third exemplary embodiment has been described above, not limited to the mode, various deformation and modification thereof can be made within the gist thereof.

Accordingly, the imprint device according to the third exemplary embodiment is capable of performing accurate positioning of the substrate 18 with respect to the substrate chuck 12 by obtaining the correction amount for positioning the substrate 18 with respect to the substrate chuck 12 from measurement data of the area including the substrate 18 and the substrate chuck 12. Furthermore, since the positioning of the substrate to be processed with respect to the substrate chuck 12 is performed from the measurement data that indicates the positional relationship before the imprint between the substrate to be processed and the substrate chuck 12, positioning can be performed without reducing the throughput of the imprinting process.

Method for Manufacturing Device

A method for manufacturing, as an article, a device (a semiconductor device, a magnetic storage medium, a liquid crystal display element, and the like), a color filter, or a hard disk, for example, will be described. Such a manufacturing method includes a step of forming a pattern on a substrate (wafer, glass plate, film substrate, and the like) using an imprint device. Such a manufacturing method further includes a step of processing the substrate on which the pattern has been formed. The processing step may include a step of removing the residual layer of the pattern. Furthermore, the processing step may include other known steps such as a step of etching the substrate with the pattern serving as a mask. The method for manufacturing an article according to the present exemplary embodiment is, compared with conventional methods, advantageous in at least one of performance, quality, productivity, and manufacturing cost of the article.

While preferable exemplary embodiments of the present disclosure have been described above, it goes without saying that the present disclosure is not limited to the various exemplary embodiments and may be deformed and modified within the scope of the gist of the disclosure. Furthermore, the imprint devices according to the first to third exemplary embodiments may be implemented not only individually but can be implemented in all conceivable combinations that can be made with the first to third exemplary embodiments.

The present disclosure is capable of providing an imprint device, a substrate conveying device, an imprinting method, and a method for manufacturing an article, which are capable of reducing a positional deviation between a substrate and a substrate holding unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-093570, filed Apr. 30, 2015, which is hereby incorporated by reference herein in its entirety.

What is claimed is:

1. An imprint apparatus comprising:
a stage configured to hold a chuck for holding a substrate, the chuck including a plurality of partial areas for suctioning and the chuck holding the substrate on the plurality of partial areas;
an obtaining unit configured to obtain an image of a portion of the chuck and an end portion of the substrate held on the plurality of partial areas, and obtain a position of the substrate and a position of the chuck, based on the obtained image,
wherein the imprint apparatus is configured to perform positioning of a substrate with respect to the chuck by using the obtained positions,
wherein a pattern is formed in each of a plurality of shot regions on the positioned substrate, and
wherein a mold release is performed in a state in which a suction force of a partial area corresponding to the shot region of the positioned substrate among the plurality of partial areas is set weaker than a suction force of other of the partial areas.

2. The imprint apparatus according to claim 1, wherein the obtaining unit is configured to obtain the image while the imprint apparatus performs imprinting in a shot area, among the plurality of shot areas, at an outermost peripheral of the positioned substrate.

3. The imprint apparatus according to claim 2, wherein the image is an image including an area in which the mold and the imprint material on the positioned substrate are in contact with each other.

4. The imprint apparatus according to claim 2, wherein the obtaining unit is configured to obtain the image through the mold.

5. The imprint apparatus according to claim 1, wherein when there are a plurality of measurement areas, the obtaining unit is configured to obtain the image of a plurality of measurement areas including the end portion of the positioned substrate and the portion of the chuck.

6. The imprint apparatus according to claim 1, further comprising:
a conveying unit configured to convey a substrate,
wherein the stage is disposed on a first platen, and
the conveying unit is disposed on a second platen that is different from the first platen.

7. A substrate conveying apparatus that conveys a substrate to the imprint apparatus according to claim 1, wherein when a substrate is conveyed to the chuck of the imprint apparatus, positioning of the substrate with respect to the chuck is performed by using the obtained positions.

8. The substrate conveying apparatus according to claim 7, wherein the substrate conveying apparatus is disposed on a second platen that is different from a first platen on which a stage for moving the chuck is disposed.

9. An imprinting method comprising:
holding, by a chuck held by a stage, the chuck including a plurality of partial areas for suctioning and the chuck holding the substrate on the plurality of partial areas;
obtaining an image of a portion of the chuck and an end portion of the substrate held on the plurality of partial areas;
obtaining a position of the substrate and a position of the chuck, based on the obtained image; and
performing positioning of a substrate with respect to the chuck by using the obtained positions,
wherein a pattern is formed in each of a plurality of shot regions on the positioned substrate, and
wherein a mold release is performed in a state in which a suction force of a partial area corresponding to the shot region of the positioned substrate among the plurality of partial areas is set weaker than a suction force of other of the partial areas.

10. A method for manufacturing an article, comprising:
forming a pattern on a substrate by using an imprint apparatus;
processing the substrate on which the pattern is formed in the forming; and
manufacturing the article from the processed substrate,
wherein the imprint apparatus includes:
a stage configured to hold a chuck for holding a substrate, the chuck including a plurality of partial areas for suctioning and the chuck holding the substrate on the plurality of partial areas;
an obtaining unit configured to obtain an image of a portion of the chuck and an end portion of the substrate held on the plurality of partial areas, and obtain a position of the substrate and a position of the chuck, based on the obtained image,
wherein the imprint apparatus is configured to perform positioning of a substrate with respect to the chuck by using the obtained positions,
wherein a pattern is formed in each of a plurality of shot regions on the positioned substrate, and
wherein a mold release is performed in a state in which a suction force of a partial area corresponding to the shot region of the positioned substrate among the plurality of partial areas is set weaker than a suction force of other of the partial areas.

* * * * *